US012765306B2

(12) United States Patent
Kim et al.

(10) Patent No.: US 12,765,306 B2
(45) Date of Patent: Oct. 13, 2026

(54) SUBSTRATE TREATING APPARATUS AND SUBSTRATE TREATING METHOD

(71) Applicant: SEMES CO., LTD., Chungcheongnam-do (KR)

(72) Inventors: Kwang Ryul Kim, Chungcheongnam-do (KR); Yun Sang Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 910 days.

(21) Appl. No.: 18/105,722

(22) Filed: Feb. 3, 2023

(65) Prior Publication Data

US 2023/0411184 A1 Dec. 21, 2023

(30) Foreign Application Priority Data

Jun. 17, 2022 (KR) ........................ 10-2022-0074301

(51) Int. Cl.

| | |
|---|---|
| ***H10P 72/00*** | (2026.01) |
| ***B23K 26/0622*** | (2014.01) |
| ***H01J 37/32*** | (2006.01) |
| ***H01S 3/00*** | (2006.01) |
| ***H01S 3/094*** | (2006.01) |

(52) U.S. Cl.

CPC ...... *H10P 72/0436* (2026.01); *B23K 26/0622* (2015.10); *H01J 37/32449* (2013.01); *H01S 3/0057* (2013.01); *H01S 3/094076* (2013.01)

(58) Field of Classification Search

None

See application file for complete search history.

(56) References Cited

U.S. PATENT DOCUMENTS

| | | | | |
|---|---|---|---|---|
| 2009/0127233 | A1 | 5/2009 | Asano et al. | |
| 2011/0033638 | A1* | 2/2011 | Ponnekanti | C23C 16/52 118/723 E |
| 2012/0234810 | A1 | 9/2012 | Kudo et al. | |
| 2014/0263208 | A1* | 9/2014 | Karlsen | B23K 26/0613 219/121.61 |
| 2017/0278761 | A1* | 9/2017 | deVilliers | H10P 74/238 |
| 2020/0251442 | A1 | 8/2020 | Choi et al. | |

(Continued)

FOREIGN PATENT DOCUMENTS

| | | |
|---|---|---|
| CN | 102668039 | 9/2012 |
| CN | 111542216 | 8/2020 |

(Continued)

OTHER PUBLICATIONS

T. Seino, Y. Arai, N. Kobayashi, T. Kudo and K. Sano, "Backside activation of power device IGBTs by microsecond-pulsed green laser annealing thermally assisted with CW diode laser," 2010, pp. 140-143 (Year: 2010).*

(Continued)

*Primary Examiner* — Katheryn A Malatek

(74) *Attorney, Agent, or Firm* — WOMBLE BOND DICKINSON (US) LLP

(57) ABSTRACT

A substrate treating apparatus includes a process chamber having a processing space in which a substrate is plasma-treated and a laser irradiation unit irradiating the substrate with a plurality of lasers having different pulse widths to heat the substrate to reach a temperature at which the substrate is plasma-treated.

17 Claims, 8 Drawing Sheets

(56) References Cited

U.S. PATENT DOCUMENTS

| | | | |
|---|---|---|---|
| 2021/0043477 | A1 | 2/2021 | Kawarazaki et al. |
| 2021/0134614 | A1 | 5/2021 | Chung et al. |

FOREIGN PATENT DOCUMENTS

| | | |
|---|---|---|
| CN | 112750721 | 5/2021 |
| KR | 10-2009-0013515 | 2/2009 |
| KR | 10-1702869 | 2/2017 |
| KR | 10-2018-0104914 | 9/2018 |
| KR | 10-2021-0018116 | 2/2021 |
| KR | 10-2021-0051502 | 5/2021 |
| TW | 1408023 | 9/2013 |
| TW | 202038307 | 10/2020 |

OTHER PUBLICATIONS

Office Action dated Nov. 19, 2025 for Korean Patent Application No. 10-2022-0074301 and its English translation from Global Dossier.

Office Action dated Jun. 4, 2026 for Taiwanese Patent Application No. 112115005 and its English summary generated by MS Copilot.

* cited by examiner

SUBSTRATE TREATING APPARATUS AND SUBSTRATE TREATING METHOD

CROSS-REFERENCE TO RELATED APPLICATIONS

This application claims benefit of priority to Korean Patent Application No. 10-2022-0074301 filed on Jun. 17, 2022 in the Korean Intellectual Property Office, the disclosure of which is incorporated herein by reference in its entirety.

BACKGROUND

1. Field

The present disclosure relates to a substrate treating apparatus and a substrate treating method.

2. Description of Related Art

Among semiconductor device manufacturing processes, an etching process is a process of selectively removing a target material to form a desired structure.

Atomic layer etching (ALE) has been studied to remove a target material in a target amount (thickness). Such an atomic layer etching process is a process of repeating a set cycle of reforming a surface of a target material and removing the reformed surface. Furthermore, since the ALE etching process may be controlled at an atomic level in removing a target material, the ALE has been actively applied in a manufacturing process of semiconductor devices that have been increasingly miniaturized.

Meanwhile, the ALE process performs the reforming operation and the removing operation, while maintaining a substrate heated to a high temperature, but there is a limitation that it takes a considerable amount of time to heat the substrate to a high temperature.

RELATED ART DOCUMENT

Patent Document (Patent Document 1) Korean Patent Registration No. 10-1702869

SUMMARY

Exemplary embodiments provide a substrate treating apparatus and a substrate treating method for quickly heating a substrate to reach an appropriate temperature for a plasma treatment.

According to an aspect of the present disclosure, a substrate treating apparatus includes: a process chamber having a processing space in which a substrate is plasma-treated; and a laser irradiation unit irradiating the substrate with a plurality of lasers having different pulse widths to heat the substrate to reach a temperature at which the substrate is plasma-treated.

The laser irradiation unit may be controlled to operate so that the plurality of the lasers having different pulse widths are irradiated to overlap for a certain period of time.

The laser irradiation unit may be controlled to operate so that the plurality of the lasers having different pulse widths are sequentially irradiated.

The laser irradiation unit may include a first irradiation unit irradiating the substrate with a continuous wave (CW) laser to preheat the substrate; and a second irradiation unit irradiating the substrate with a pulsed laser.

The first irradiation unit and the second irradiation unit may be controlled to operate so that the CW laser and the pulsed laser are irradiated to overlap for a certain period of time.

The first irradiation unit and the second irradiation unit may be controlled to operate so that the CW laser and the pulsed laser are sequentially irradiated.

The first irradiation unit may be a laser diode or a fiber laser oscillator, and the second irradiation unit is a green laser oscillator.

The laser irradiation unit may be disposed outside the process chamber, and the process chamber may include a transparent window through which the laser irradiated from the laser irradiation unit passes.

The laser irradiation unit may be disposed upper and lower portions of the process chamber to irradiate upper and lower surfaces of the substrate with the laser, each of the upper and lower portions of the process chamber may be formed of the transparent window so that the laser irradiated from the laser irradiation unit passes therethrough, and a substrate support unit disposed between the transparent window of the lower portion of the process chamber and the substrate may be formed of a transparent material so that the laser passing through the transparent window passes therethrough.

The substrate treating apparatus may further include: a plasma generating unit installed in the process chamber and generating plasma in the processing space, wherein the plasma generating unit includes: a gas supply unit disposed in the process chamber, supplying a treatment gas to the process chamber, and functioning as a plasma generating electrode; and a substrate support unit disposed in the process chamber to support the substrate and functioning as a plasma generating electrode.

According to another aspect of the present disclosure, a substrate treating apparatus includes: a process chamber having a processing space in which a substrate is plasma-treated; a gas supply unit disposed in the process chamber, supplying a treatment gas to the process chamber, and functioning as a plasma generating electrode; a gas discharge unit formed on one side of the process chamber or the gas supply unit; a substrate support unit disposed in the process chamber to support the substrate and functioning as a plasma generating electrode; and a laser irradiation unit irradiating the substrate with a plurality of lasers having different pulse widths to heat the substrate to reach a temperature at which the substrate is plasma-treated.

The laser irradiation unit may be disposed in an upper portion of the process chamber and irradiates an upper surface of the substrate with the laser, the upper portion of the process chamber may be formed of a transparent window so that the laser irradiated from the laser irradiation unit passes therethrough, and the gas supply unit disposed between the transparent window and the substrate is formed of a transparent material so that the laser passing through the transparent window passes therethrough.

According to another aspect of the present disclosure, a substrate treating method includes: a substrate heating operation of irradiating a substrate with a plurality of lasers having different pulse widths to heat the substrate to reach a temperature at which the substrate is plasma-treated; and a substrate treating operation of plasma-treating the substrate.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
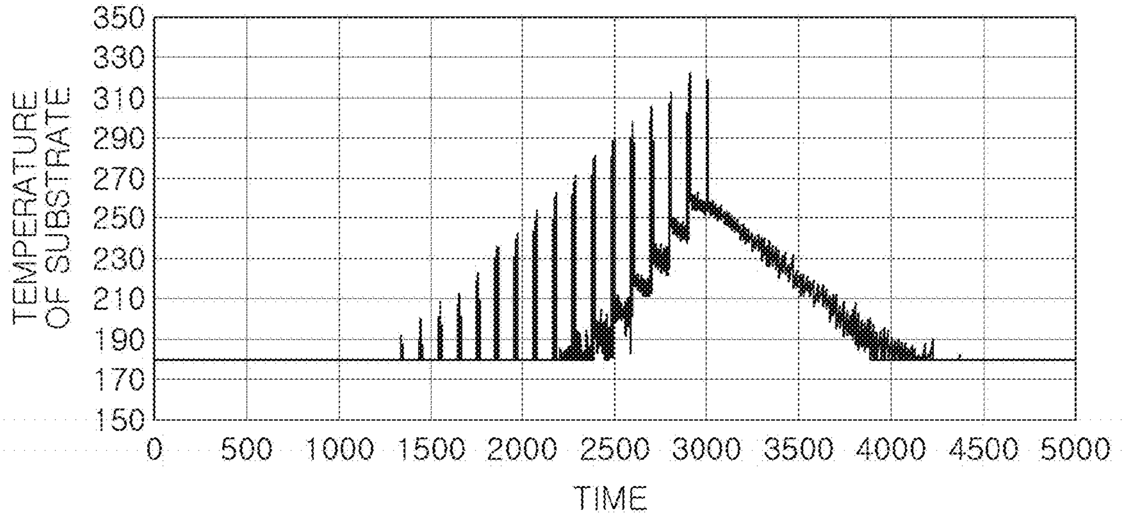
FIGS. 1 and 2 are graphs illustrating a temperature change of a substrate by pulsed laser irradiation.

Hereinafter, exemplary embodiments will be described in detail with reference to the accompanying drawings such that they may be easily practiced by those skilled in the art to which the present disclosure pertains. In describing the present disclosure, if a detailed explanation for a related known function or construction is considered to unnecessarily divert the gist of the present disclosure, such explanation will be omitted but would be understood by those skilled in the art. Also, similar reference numerals are used for the similar parts throughout the specification. In this disclosure, terms. such as "above", "upper portion", "upper surface", "below", "lower portion", "lower surface", "lateral surface", and the like, are determined based on the drawings, and in actuality, the terms may be changed according to a direction in which a device or an element is disposed.

It will be understood that when an element is referred to as being "connected to" another element, it may be directly connected to the other element or intervening elements may also be present. In contrast, when an element is referred to as being "directly connected to" another element, no intervening elements are present. In addition, unless explicitly described to the contrary, the word "comprise" and variations. such as "comprises" or "comprising," will be understood to imply the inclusion of stated elements but not the exclusion of any other elements.

An etching process is a process of cutting off a circuit pattern drawn by exposure or a thin film on a substrate by deposition. However, as circuit patterns of substrates become finer and correspondingly precise etching is required, an atomic layer etching (ALE) process is utilized.

The ALE process is a process in which etching of a substrate is performed in units of atomic layers. In this ALE process, a process is performed by performing a reforming operation and a removing operation while the substrate is heated to a high temperature in order to increase an etching rate. The reforming operation is an operation in which a source gas is adsorbed and reacted on a surface of a substrate formed of silicon so that characteristics of the surface change. The removing operation is an operation in which an ionized inert gas (plasma ions) applies a physical impact to the surface of the substrate to remove a surface atomic layer.

Figure 2:
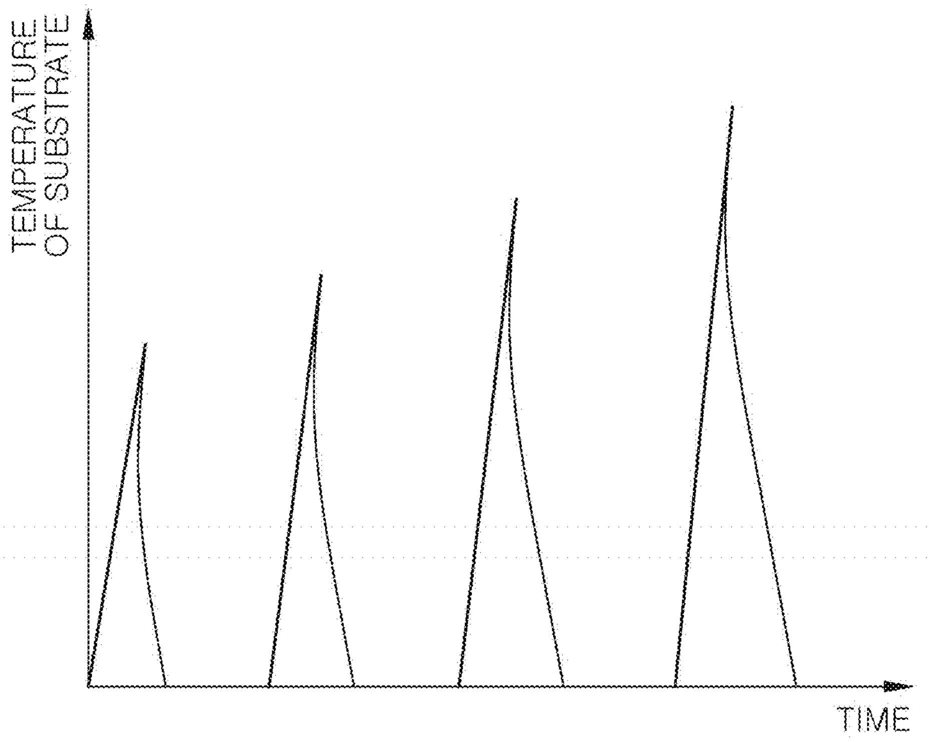

FIGS. 1 and 2 are graphs illustrating a temperature change of the substrate by pulsed laser irradiation.

Among ALE are thermal ALE and plasma-enhanced ALE (PE ALE). Thermal ALE is performed by a thermal adsorption method that induces a reaction between a source gas and substrate surface atoms using heat inside a process chamber.

In the thermal ALE process, a pulsed laser is used as a rapid thermal source to heat the substrate. In this manner, by using a rapid heat source in the thermal ALE process, a process time may be shortened and device damage may be minimized.

However, a pulsed laser having a wavelength of about 500 nm suitable for an existing cyclic process cannot quickly heat a substrate to a high treatment temperature due to a short pulse width. Specifically, when the pulsed laser is irradiated from a laser oscillator, since the pulse width of the pulsed laser is very short, the pulsed laser is repeatedly emitted to the substrate. As illustrated in FIGS. 1 and 2, there is a time interval between irradiation of the pulsed laser (with a short pulse width) and next irradiation of the pulsed laser. As a result, during the time interval when pulsed laser irradiation is not performed, cooling may occur in the substrate, and thus, the substrate cannot be heated to an appropriate temperature within a short period of time, that is, within milliseconds (~ms) and microseconds (~us) of a certain time.

Meanwhile, in order to improve this, a method of continuously irradiating a pulsed laser by irradiating a pulsed laser from another pulsed laser source (a pulsed laser oscillator) between the irradiation of the pulsed laser and the next irradiation of the pulsed laser has been proposed. However, even in this method, unless pulse energy of the pulsed laser is very high (~1000 J), it is difficult to rapidly raise the temperature of the substrate to 400° C. or higher, which is an appropriate temperature for the process, within a short time suitable for a cyclic process. That is, even if pulsed lasers are continuously irradiated from two or more pulsed laser sources, all types of lasers are pulsed lasers with a short pulse width rather than a long pulse width, it is not possible to realize rapid temperature increase of the substrate.

Figure 3:
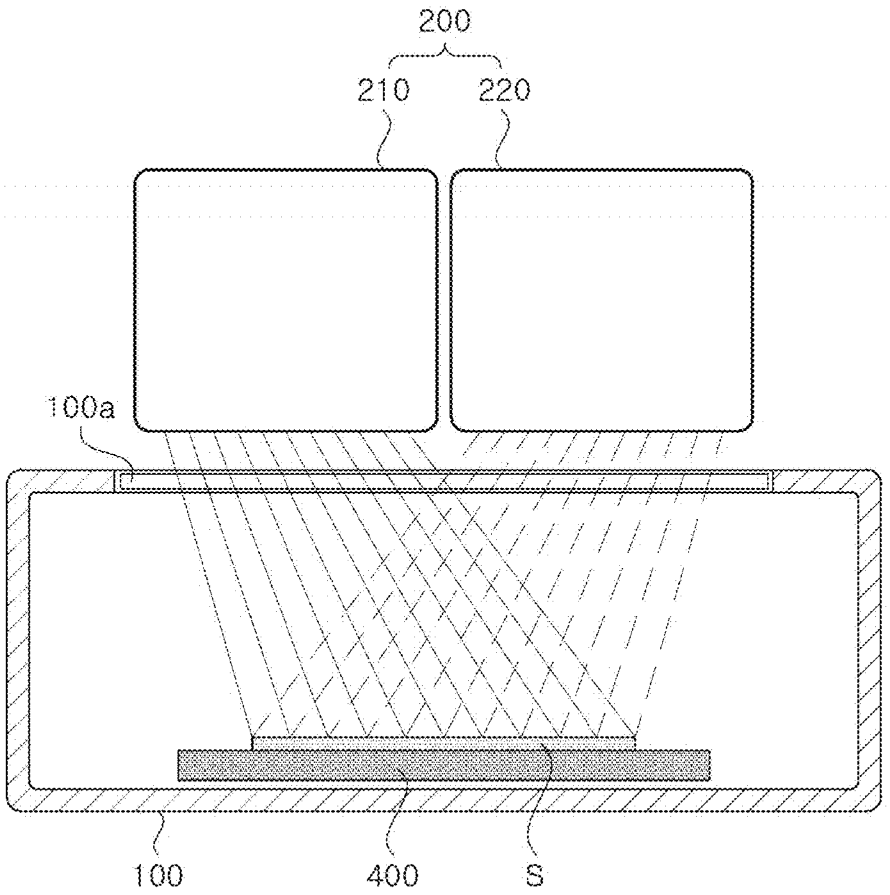
FIG. 3 is a view illustrating a substrate treating apparatus according to a first exemplary embodiment in the present disclosure.

FIG. 3 is a view illustrating a substrate treating apparatus according to a first exemplary embodiment in the present disclosure.

In order to overcome the limitations mentioned above, the substrate treating apparatus according to the present disclosure is configured to irradiate a substrate S with a plurality of lasers having different pulse widths to reach a temperature at which the substrate S is to be treated.

Specifically, the substrate treating apparatus according to the present disclosure includes a process chamber 100 and a laser irradiation unit 200 as illustrated in FIG. 3.

The process chamber 100 is a chamber having a processing space in which the substrate S is plasma-treated. As a representative example, the process chamber 100 may be used in a plasma etching process in which the substrate S is plasma-etched. Furthermore, the process chamber 100 is not limited by the present disclosure and may be used in a process including a plasma treatment, while requiring a high-temperature state of the substrate S. Specifically, the process chamber 100 may be utilized in a capacitively coupled plasma (CCP) chamber, and such a capacitively coupled plasma (CCP) chamber may be applied to thermal ALE.

The process chamber 100 may include a transparent window **100*a* through which the laser irradiated from the laser irradiation unit 200 passes. If the laser irradiation unit 200 is disposed outside the process chamber 100, a portion of the process chamber 100 is replaced by the transparent window 100***a* so that the laser irradiated from the laser irradiation unit 200 passes through the process chamber 100.

The laser irradiation unit 200 irradiates the substrate S seated on a substrate support unit 400 with a plurality of lasers having different pulse widths to heat the substrate S. For example, the laser irradiation unit 200 may include a first irradiation unit 210 and a second irradiation unit 220.

The first irradiation unit 210 irradiates the substrate S with a continuous wave (CW) laser. The CW laser is a continuous wave laser in which the laser is continuously emitted. That is, the CW laser has a pulse width different from that of the pulsed laser, and specifically, the pulse width emitted from the first irradiation unit 210 is relatively longer than that of the pulsed laser.

The second irradiation unit 220 irradiates the substrate S with a pulsed laser. The pulsed laser is a laser having an extremely short pulse width, and is an ultra-short laser having a very short pulse width. That is, the pulsed laser has a pulse width different from that of the CW laser, and specifically, the pulse width emitted from the second irradiation unit 220 is relatively shorter than that of the CW laser.

Figure 4:
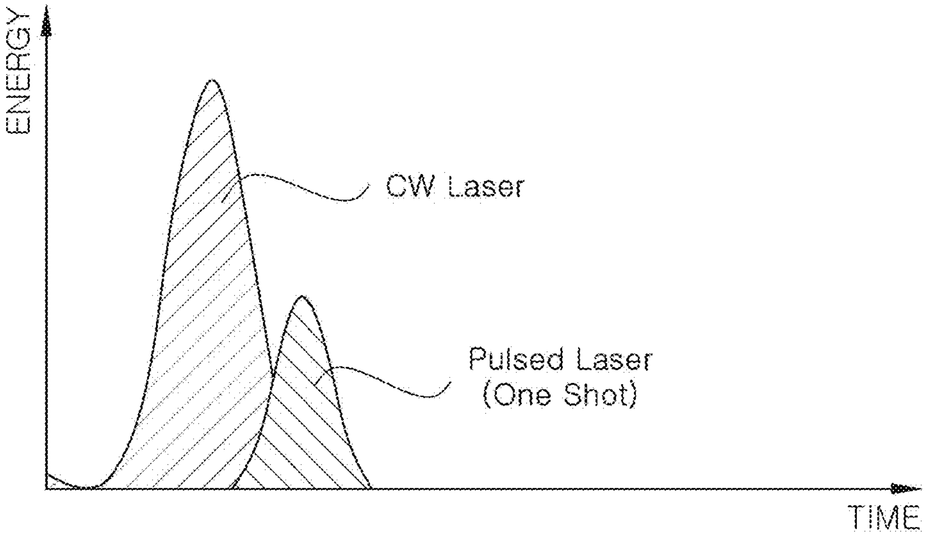
FIG. 4 is a graph illustrating energy for a plurality of lasers having different pulse widths in the present disclosure.

FIG. 4 is a graph illustrating energy for a plurality of lasers having different pulse widths in the present disclosure.

Specifically, as the first irradiation unit 210, a laser diode or a fiber laser oscillator that irradiates a CW laser may be used. As the second irradiation unit 220, a green laser oscillator that irradiates pulsed laser may be used.

Referring to the drawing, the first irradiation unit 210 may be a laser diode (LD) that irradiates a laser having a wavelength of about 808 nm to 980 nm, which may obtain maximum pulse energy at a relatively low cost. Alternatively, the first irradiation unit 210 may be a fiber laser oscillator that irradiates a laser having a wavelength of about 1070 nm.

Also, as the second irradiation unit 220, a green laser oscillator that irradiates a laser having a wavelength of about 500 nm may be utilized.

Figure 5:
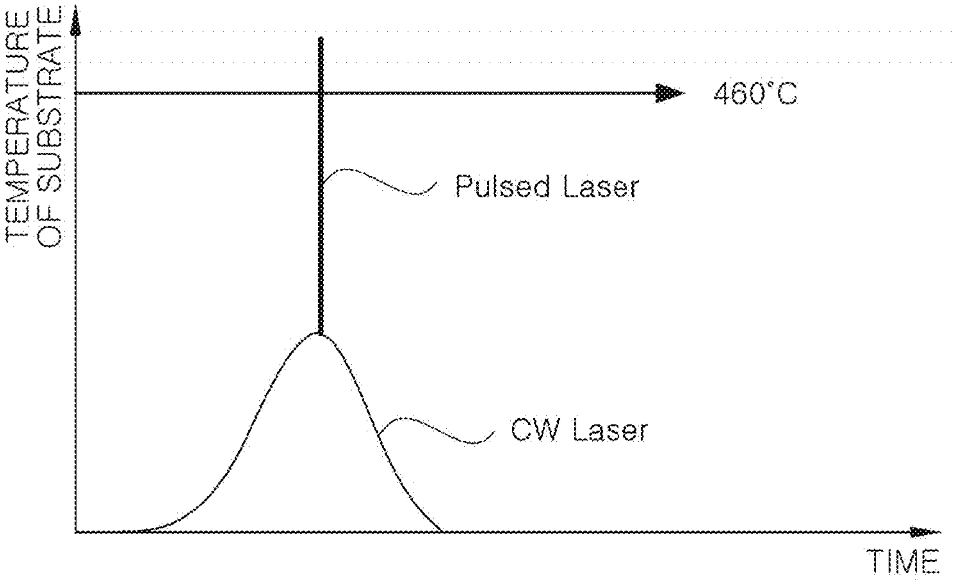
FIG. 5 is a graph illustrating a temperature of a substrate heated by a plurality of lasers having different pulse widths in the present disclosure.

FIG. 5 is a graph illustrating a temperature of a substrate heated by a plurality of lasers having different pulse widths in the present disclosure.

Referring to the drawing, the CW laser of the first irradiation unit 210 serves to preheat the substrate S to reach 400° C. or higher, which is an appropriate process temperature, that is, pre-heating. In addition, the pulsed laser of the second irradiation unit 220 serves to increase a temperature of the substrate S being preheated or already preheated by the CW laser of the first irradiation unit 210 to a peak temperature (400° C. or higher). Due to this, the entire surface of the substrate S may be heated to 400° C. or higher within a very fast time (~ms), as illustrated in the drawing, compared to the conventional method using only a pulsed laser.

Here, for example, the laser irradiation unit 200 may be controlled to operate so that a plurality of lasers having different pulse widths are irradiated to overlap each other for a certain period of time. Specifically, the first irradiation unit 210 and the second irradiation unit 220 may be controlled to operate so that the CW laser and the pulsed laser are irradiated to overlap each other for a certain period of time.

Also, as another example, the laser irradiation unit 200 may be controlled to operate so that a plurality of lasers having different pulse widths are sequentially irradiated. Specifically, the first irradiation unit 210 and the second irradiation unit 220 may be controlled to operate so that the CW laser and the pulsed laser are sequentially irradiated.

Figure 6:
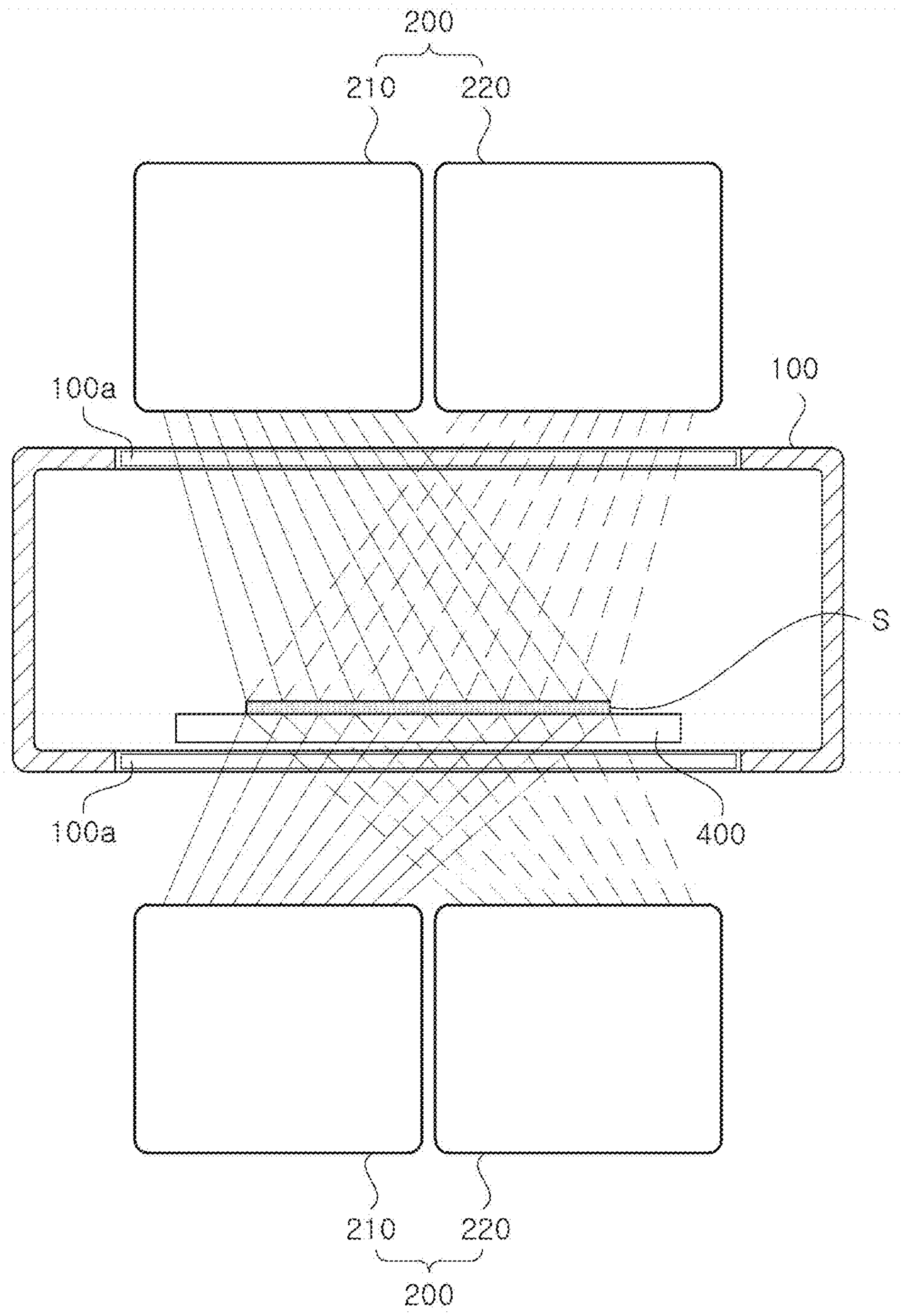
FIG. 6 is a view illustrating a substrate treating apparatus according to a second exemplary embodiment in the present disclosure.

FIG. 6 is a view illustrating a substrate treating apparatus according to a second exemplary embodiment in the present disclosure.

Referring to the drawing, in the substrate treating apparatus according to the second exemplary embodiment, compared to the substrate treating apparatus according to the first exemplary embodiment described above, the laser irradiation unit 200 may be additionally disposed below the process chamber 100.

Specifically, the laser irradiation unit 200 may be disposed on the upper and lower sides of the process chamber 100. The laser irradiation unit 200 disposed on the upper side of the process chamber 100 irradiates an upper surface of the substrate S with a laser. The laser irradiation unit 200 disposed below the process chamber 100 irradiates a lower surface of the substrate S with a laser. Accordingly, the temperature of the substrate S may be raised to an appropriate process temperature in a faster time.

Upper and lower portions of the process chamber 100 may be formed of a transparent window 100*a* so that the laser irradiated from the laser irradiation unit 200 passes therethrough. That is, one transparent window 100*a* is formed at an upper portion of the process chamber 100, and the laser of the laser irradiation unit 200 disposed above the process chamber 100 passes through the transparent window 100*a* to the upper surface of the substrate S. In addition, another transparent window 100*a* is formed at a lower portion of the process chamber 100 and the lower surface of the substrate S is irradiated with the laser of the laser irradiation unit 200 disposed below the process chamber 100 passing through the transparent window 100*a*.

At this time, the substrate support unit 400 disposed between the transparent window 100*a* at the lower portion of the process chamber 100 and the substrate support unit 400 may be formed of a transparent material so that the laser passing through the transparent window 100*a* may pass therethrough.

Meanwhile, the laser irradiation unit 200 irradiates the substrate S with a plurality of lasers having different pulse widths to heat the substrate S. Such a laser irradiation unit 200 may include the first irradiation unit 210 and the second irradiation unit 220, for example, and since details thereof have been described above in the first exemplary embodiment in the present disclosure, a detailed description thereof will be omitted.

Figure 7:
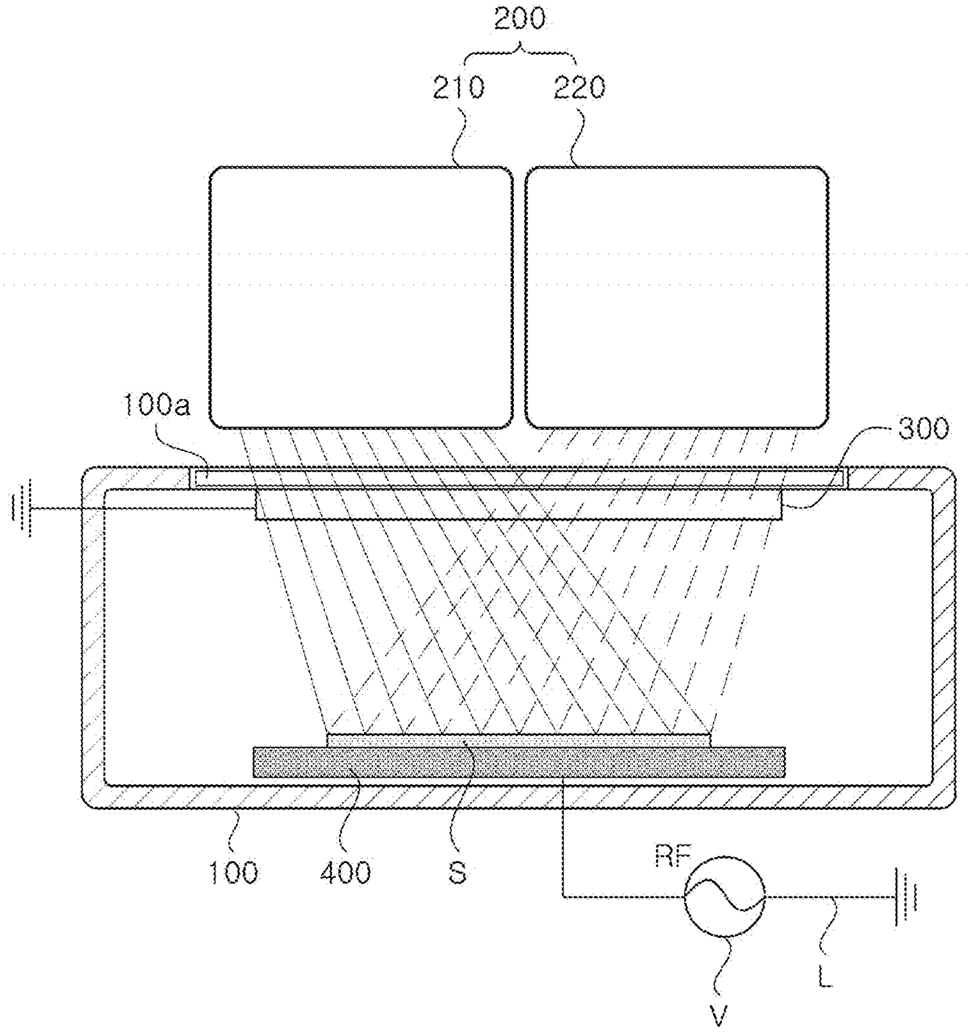
FIG. 7 is a view illustrating a substrate treating apparatus according to a third exemplary embodiment in the present disclosure.

FIG. 7 is a view illustrating a substrate treating apparatus according to a third exemplary embodiment in the present disclosure.

Referring to the drawing, the substrate treating apparatus according to the third exemplary embodiment may be applied to thermal ALE.

Specifically, the substrate treating apparatus according to the third exemplary embodiment includes a process chamber 100, a gas supply unit 300, a gas discharge unit, a substrate support unit 400, and a laser irradiation unit 200.

The process chamber 100 is a chamber having a processing space in which the substrate S is plasma-treated. For example, the process chamber 100 may be utilized in a CCP chamber. Such a CCP chamber may be applied to thermal ALE.

The gas supply unit 300 is disposed within the process chamber 100 and supplies a treatment gas to the process chamber 100. For example, the gas supply unit 300 may supply a source gas (a precursor), an etching gas, and a purge gas to the process chamber 100 for ALE. Although not illustrated in the drawing, the gas discharge unit may be formed on one side of the process chamber 100 or the gas supply unit 300 to discharge the treatment gas supplied by the gas supply unit 300.

The substrate support unit 400 is disposed in the process chamber 100 and supports the substrate S.

A plasma generating unit of the present disclosure includes the gas supply unit 300 and the substrate support unit 400 described above. Each of the gas supply unit 300 and the substrate support unit 400 may function as an electrode for plasma generation. That is, the gas supply unit 300 and the substrate support unit 400 are used as electrodes to convert the treatment gas supplied into the process chamber 100 into a plasma state. An RF power supply V may be installed in a power supply line L connected to the substrate support unit 400. Furthermore, a capacitor (not shown) may be installed on the RF power supply V in the power supply line L to form a self-DC bias toward the substrate support unit 400, which is an electrode adjacent to the RF power supply V. As a capacitor, that is, a blocking capacitor, captures (accumulates) passing electrons to become a negative voltage, positive ions of plasma are accelerated to the substrate S to improve an etching rate.

Also, the laser irradiation unit 200 irradiates the substrate S with a plurality of lasers having different pulse widths to reach a temperature at which the substrate S is processed. Such a laser irradiation unit 200 may include the first irradiation unit 210 and the second irradiation unit 220, for example, and since details thereof have been described above in the first exemplary embodiment, a description thereof will be omitted herein.

Meanwhile, the laser irradiation unit 200 is disposed above the process chamber 100 to irradiate the upper surface of the substrate S with a laser, and the process chamber 100 may have an upper portion formed of the transparent window 100*a* so that the laser irradiated from the laser irradiation unit 200 passes therethrough.

In addition, the gas supply unit 300 disposed between the transparent window 100*a* at an upper portion of the process chamber 100 and the substrate S may be formed of a transparent material so that the laser passing through the transparent window 100*a* may pass therethrough.

Figure 8:
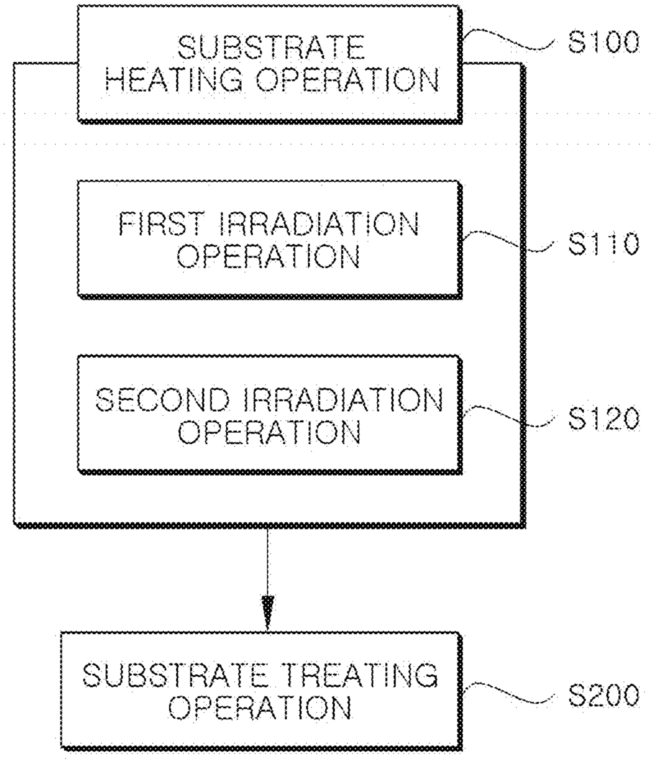
FIG. 8 is a view illustrating a substrate treating method according to an exemplary embodiment in the present disclosure.

FIG. 8 is a view illustrating a substrate treating method according to an exemplary embodiment in the present disclosure.

Referring to the drawing, the substrate treating method according to the present disclosure includes a substrate heating operation (S100) and a substrate treating operation (S200).

The substrate heating operation (S100) is an operation of irradiating a substrate with a plurality of lasers having different pulse widths to heat the substrate so that the substrate reaches a plasma treatment temperature.

For example, the substrate heating operation (S100) may include a first irradiation operation (S110) and a second irradiation operation (S120). The first irradiation operation (S110) is an operation of irradiating the substrate with a continuous wave (CW) laser to preheat the substrate. The second irradiation operation (S120) is an operation of irradiating the substrate with a pulsed laser.

The CW laser is a continuous wave laser in which lasers are continuously emitted, and a pulsed laser is a laser having an extremely short pulse width, and is an ultra-short laser having a very short pulse width. The CW laser serves to preheat the substrate to reach a state of 400° C. or higher, which is an appropriate temperature for the plasma treatment process, that is, to perform pre-heating. The pulsed laser serves to increase a temperature of the substrate S being preheated or already preheated by the CW laser of the first irradiation unit 210 to a peak temperature (400° C. or higher). Due to this, the entire surface of the substrate S may be heated to 400° C. or higher within a very fast time (~ms), as illustrated in the drawing, compared to the conventional method using only a pulsed laser.

In the substrate heating operation (S100), for example, a plurality of lasers having different pulse widths may be irradiated to overlap for a certain period of time. As another example, in the substrate heating operation (S100), a plurality of lasers having different pulse widths may be sequentially irradiated.

Next, the substrate treating operation (S200) is performed. The substrate treating operation (S200) is an operation of plasma-treating the substrate. As a representative example, the substrate treating operation (S200) is an operation of plasma-etching the substrate. Furthermore, the substrate treating operation (S200) is not limited by the present disclosure and may include a process including a plasma treatment, while requiring a high-temperature state of the substrate S, such as plasma deposition.

The substrate treating apparatus and the substrate treating method according to the present disclosure are configured to heat a substrate by irradiating the substrate with a plurality of lasers having different pulse widths so that the entire area of the substrate may reach an appropriate temperature of a plasma treatment within a short period of time.

While example exemplary embodiments have been illustrated and described above, it will be apparent to those skilled in the art that modifications and variations could be made without departing from the scope of the present disclosure as defined by the appended claims.

What is claimed is:

1. A substrate treating apparatus comprising:

a process chamber having a processing space in which a substrate is plasma-treated; and a laser irradiation unit irradiating the substrate with a plurality of lasers having different pulse widths to heat the substrate to reach a temperature at which the substrate is plasma-treated, wherein the laser irradiation unit is disposed outside the process chamber, and the process chamber includes a transparent window through which the plurality of lasers irradiated from the laser irradiation unit pass, wherein the laser irradiation unit is disposed above and below the process chamber to irradiate upper and lower surfaces of the substrate with the plurality of lasers, each of the upper and lower portions of the process chamber is formed of the transparent window so that the plurality of lasers irradiated from the laser irradiation unit pass through the transparent window of each of the upper and lower portions of the process chamber, and a substrate support unit is disposed between the transparent window of the lower portion of the process chamber and the substrate and is formed of a transparent material so that the plurality of lasers passing through the transparent window of the lower portion of the process chamber pass through the substrate support unit.

2. The substrate treating apparatus of claim 1, wherein the laser irradiation unit is controlled to operate so that the plurality of the lasers having different pulse widths are irradiated to overlap for a certain period of time.

3. The substrate treating apparatus of claim 1, wherein the laser irradiation unit is controlled to operate so that the plurality of the lasers having different pulse widths are sequentially irradiated.

4. The substrate treating apparatus of claim 1, wherein the laser irradiation unit includes:

a first irradiation unit irradiating the substrate with a continuous wave (CW) laser to preheat the substrate; and a second irradiation unit irradiating the substrate with a pulsed laser.

5. The substrate treating apparatus of claim 4, wherein the first irradiation unit and the second irradiation unit are controlled to operate so that the CW laser and the pulsed laser are irradiated to overlap for a certain period of time.

6. The substrate treating apparatus of claim 4, wherein the first irradiation unit and the second irradiation unit are controlled to operate so that the CW laser and the pulsed laser are sequentially irradiated.

7. The substrate treating apparatus of claim 4, wherein the first irradiation unit is a laser diode or a fiber laser oscillator, and the second irradiation unit is a green laser oscillator.

8. The substrate treating apparatus of claim 1, further comprising:

a plasma generating unit that generates plasma in the processing space, the plasma generating unit comprises:

a gas supply unit, the gas supply unit being disposed in the process chamber, supplies a treatment gas to the process chamber, and functions as a first plasma generating electrode of the plasma generating unit; and the substrate support unit disposed in the process chamber to support the substrate and functioning as a second plasma generating electrode of the plasma generating unit.

9. A substrate treating apparatus comprising:

a process chamber having a processing space in which a substrate is plasma-treated;

a gas supply unit disposed in the process chamber, supplying a treatment gas to the process chamber, and functioning as a first plasma generating electrode within the processing space;

a gas discharge unit formed on one side of the process chamber or the gas supply unit;

a substrate support unit disposed in the process chamber to support the substrate and functioning as a second plasma generating electrode within the processing space; and a laser irradiation unit irradiating the substrate with a plurality of lasers having different pulse widths to heat the substrate to reach a temperature at which the substrate is plasma-treated, wherein the laser irradiation unit is disposed above the process chamber and irradiates an upper surface of the substrate with the plurality of lasers, the upper portion of the process chamber is formed of a transparent window so that the plurality of lasers irradiated from the laser irradiation unit pass through the transparent window, and the gas supply unit is disposed between the transparent window and the substrate, and the gas supply unit is formed of a transparent material so that the plurality of lasers passing through the transparent window pass through the gas supply unit.

10. The substrate treating apparatus of claim 9, wherein the laser irradiation unit includes:

a first irradiation unit irradiating the substrate with a continuous wave (CW) laser to preheat the substrate; and a second irradiation unit irradiating the substrate with a pulsed laser.

11. The substrate treating apparatus of claim 10, wherein the first irradiation unit and the second irradiation unit are controlled to operate so that the CW laser and the pulsed laser are irradiated to overlap for a certain period of time.

12. The substrate treating apparatus of claim 10, wherein the first irradiation unit and the second irradiation unit are controlled to operate so that the CW laser and the pulsed laser are sequentially irradiated.

13. The substrate treating apparatus of claim 10, wherein the first irradiation unit is a laser diode or a fiber laser oscillator, and the second irradiation unit is a green laser oscillator.

14. A substrate treating method comprising:

a substrate heating operation of irradiating a substrate with a plurality of lasers having different pulse widths to heat the substrate to reach a temperature at which the substrate is plasma-treated; and a substrate treating operation of plasma-treating the substrate, wherein the substrate is disposed in a process chamber having a processing space in which the substrate is plasma-treated, the plurality of lasers are generated by a laser irradiation unit that is disposed above the process chamber and that irradiates an upper surface of the substrate with the plurality of lasers, the upper portion of the process chamber is formed of a transparent window so that the plurality of lasers irradiated from the laser irradiation unit pass through the transparent window, and a gas supply unit that supplies a treatment gas into the process chamber is disposed between the transparent window and the substrate, and the gas supply unit is formed of a transparent material so that the plurality of lasers passing through the transparent window pass through the gas supply unit.

15. The substrate treating method of claim 14, wherein, in the substrate heating operation, the plurality of lasers having different pulse widths are irradiated to overlap for a certain period of time.

16. The substrate treating method of claim 14, wherein, in the substrate heating operation, the plurality of lasers having different pulse widths are sequentially irradiated.

17. The substrate treating method of claim 14, wherein the substrate heating operation includes:

a first irradiation operation of irradiating the substrate with a continuous wave (CW) laser to pre-heat the substrate; and a second irradiation operation of irradiating the substrate with a pulsed laser.

* * * * *